United States Patent
Suzuki

(10) Patent No.: US 7,565,045 B2
(45) Date of Patent: Jul. 21, 2009

(54) TUNABLE LIGHT SOURCE APPARATUS, AND ADJUSTMENT METHOD AND CONTROL PROGRAM OF THE SAME

(75) Inventor: Kouichi Suzuki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 12/107,906

(22) Filed: Apr. 23, 2008

(65) Prior Publication Data

US 2008/0259437 A1 Oct. 23, 2008

(51) Int. Cl.
*G02B 6/26* (2006.01)
(52) U.S. Cl. ............................ 385/27; 359/326; 385/15; 385/30
(58) Field of Classification Search ............. 385/27–30, 385/14, 15, 24; 359/326; 372/20
See application file for complete search history.

(56) References Cited

U.S. PATENT DOCUMENTS

| | | | | |
|---|---|---|---|---|
| 4,852,117 | A * | 7/1989 | Po ............................... | 372/97 |
| 5,929,430 | A * | 7/1999 | Yao et al. ..................... | 250/205 |
| 6,014,217 | A * | 1/2000 | Sanders et al. .............. | 356/461 |
| 6,608,947 | B2 * | 8/2003 | Margalit et al. .............. | 385/14 |
| 6,891,865 | B1 * | 5/2005 | Ma .............................. | 372/20 |
| 7,065,276 | B2 * | 6/2006 | Scheuer et al. ................ | 385/50 |
| 7,174,064 | B2 * | 2/2007 | Sayyah et al. ................ | 385/15 |
| 7,184,451 | B2 * | 2/2007 | Ilchenko et al. ............... | 372/20 |
| 7,389,028 | B2 * | 6/2008 | Suzuki et al. ................. | 385/50 |
| 7,389,053 | B1 * | 6/2008 | Ilchenko et al. ............. | 398/183 |
| 7,421,168 | B1 * | 9/2008 | Goutzoulis ................... | 385/50 |
| 2004/0120638 | A1 * | 6/2004 | Frick ............................ | 385/27 |
| 2005/0201432 | A1 * | 9/2005 | Uehara et al. ................. | 372/30 |
| 2006/0008272 | A1 * | 1/2006 | Abeles ......................... | 398/48 |
| 2006/0083144 | A1 * | 4/2006 | Piede et al. .................. | 369/100 |
| 2006/0198416 | A1 * | 9/2006 | Yamazaki .................... | 372/94 |
| 2007/0230856 | A1 * | 10/2007 | Yamazaki ....................... | 385/5 |
| 2008/0001062 | A1 * | 1/2008 | Gunn et al. .................. | 250/206 |
| 2008/0175538 | A1 * | 7/2008 | Chu et al. ..................... | 385/30 |
| 2008/0187268 | A1 * | 8/2008 | Kaneko et al. ................ | 385/27 |
| 2008/0212104 | A1 * | 9/2008 | Sanders ....................... | 356/480 |
| 2008/0240646 | A1 * | 10/2008 | Yamazaki .................... | 385/14 |

FOREIGN PATENT DOCUMENTS

| | | |
|---|---|---|
| JP | 62100706 A | 5/1987 |
| JP | 2003527625 A | 9/2003 |
| JP | 2005327881 A | 11/2005 |
| JP | 2006196554 A | 7/2006 |

* cited by examiner

*Primary Examiner*—Ellen Kim

(57) ABSTRACT

The present invention aims to provide a tuning light source apparatus including a multiple-optical resonator, where the resonance frequencies of the respective optical resonators in a multiple-optical resonator are exactly coincided with the set frequency, and the frequency of the output laser beam is locked within a range of about 1 GHz from the set frequency. Current is flowed to TO phase shifters based on lights detected by light receiving elements, and the resonance wavelengths of resonators are adjusted in an aim of obtaining a state in which an intensity of an oscillation light becomes a maximum and at the same time an intensity of a light from a through port becomes a minimum.

13 Claims, 11 Drawing Sheets

TUNABLE LIGHT SOURCE APPARATUS, AND ADJUSTMENT METHOD AND CONTROL PROGRAM OF THE SAME

CROSS-REFERENCE TO RELATED APPLICATION

This application is based upon and claims the benefit of priority from Japanese patent application No. 2007-112642, filed on Apr. 23, 2007, the disclosure of which is incorporated herein in its entirety by reference.

BACKGROUND OF THE INVENTION

1. Field of the Invention

The present invention relates to tunable light source apparatuses used in optical fiber communication, light source wavelength adjustment methods, and light source wavelength adjustment programs, in particular, to a tunable light source apparatus used in an optical communication of WDM (Wavelength Division Multiplexing) transmission system, a light source wavelength adjustment method, and a light source wavelength adjustment program.

2. Related Art

Recently, in the field of optical communication, the WDM transmission system of converting a plurality of data signals to light signals of different wavelengths, and multiplexing the plurality of light signals of different wavelengths to be transmitted in one optical fiber thereby realizing a large capacity optical transmission is widely put to practical use. Further, practical application of the DWDM (Dense Wavelength Division Multiplexing) transmission system, which can realize denser multiplexing than the WDM technique, is advancing.

In the optical communication system of the WDM transmission system, the transmission light wavelength is set on a frequency grid (ITU-Grid) standardized by the ITU (International Telecommunication Union). Thus, for every wavelength on the ITU-Grid, a corresponding light source is required respectively, and furthermore, since the ITU-Grid frequency spacing is set to be small in the DWDM, the number of settable wavelength increases, and greater number of light sources are required. In order to solve such disadvantage, practical application of a tunable light source apparatus in which the output wavelength can be freely controlled is advancing.

In order to realize a reliable optical communication, the tunable light source apparatus needs to set the frequency of the output light on the ITU-Grid, and continuously lock the frequency of the output light within a frequency range of about 1 GHz from such set frequency. A multiple-optical resonator type tunable light source apparatus serving as the tunable light source apparatus described above is disclosed in Japanese Laid-Open Patent Publication No. 2006-196554 (Patent Document 1).

The tunable light source apparatus of Patent Document 1 has a configuration in which laser oscillation occurs at a wavelength at which all three transmission resonance frequencies of three ring resonators coincide, where the desired laser oscillation frequency is output by adjusting the input power to a TO (Thermo-Optic) phase shifter arranged in each ring resonator.

In such tunable light source apparatus, the filter loss becomes the smallest, and the stability of the wavelength and the power tolerance of the TO can be maximized when the resonance frequencies of the three ring resonators are exactly coinciding on the oscillation frequency.

However, in the multi-purpose tunable light source apparatus, the laser oscillation wavelength fluctuates and deviates from the ITU-Grid due to change in outside temperature and variation in refractive index of the light waveguide portion. Particularly, since the tunable light source apparatus of external resonator type, such as PLC (Planar Lightwave Circuit) type, has a structure in which the oscillation frequency can be freely changed, and thus has a characteristic in that the wavelength tends to easily vary inherently. For this reason, in order to maintain the stability of the laser wavelength over a long period of time, the shift of central wavelength needs to be detected and corrected with various methods.

In the tunable light source disclosed in patent document 1, frequency ripples having a period of various sizes are generated due to the presence of various minor reflections such as internal reflection of an SOA (Semiconductor Optical Amplifier), PLC/SOA connecting point reflection and the like. Since the frequency and the intensity of the ripple are changed depending on gain current, environment temperature, and the like, the condition in which the exit light level and the SMSR (Sub-Mode Suppression Ratio) become a maximum also changes.

Due to the influence of such ripples, a state in which the central frequencies in the three ring resonators do not coincide arises even if the exit light level is a maximum, and whether or not the three central frequencies are exactly coinciding on the oscillation frequency is difficult to be determined only from the characteristics of the output exit laser beam.

In the multiple-optical resonator disclosed in patent document 1, when laser oscillation starts at a certain wavelength, the gain is concentrated thereby other sub-oscillation modes are suppressed, and thus laser oscillation similarly occurs even if the central frequencies in the three ring resonators are slightly shifted, and whether or not the three central frequencies are accurately coinciding on the oscillation frequency is difficult to be determined only from the characteristics of the exit light.

A mode gain difference, which is the transmission loss difference between one oscillating wavelength channel and an adjacent oscillating channel, in a spectrum of a single mode laser from the PLC multiple-optical resonator disclosed in patent document 1 takes a maximum value when all three central frequencies in the three ring resonators exactly coincide. Disadvantages such as unexpected wavelength skipping etc. arise unless the assumed mode gain difference is obtained. If the wavelength of the tunable light source automatically switches to another wavelength due to wavelength skipping, the communication of the relevant wavelength becomes disconnected, and furthermore, the communication of another wavelength channel also becomes disconnected.

In the multiple-optical resonator type tunable light source apparatus of Patent Document 1, in order to increase the mode gain difference, a method of increasing the finesse of the optical resonator filter may be adopted. The frequency characteristics of the optical resonator filter becomes of narrower band and the gain difference also becomes larger as the number of average turns of the ring resonator is increased. If the average number of turns increases, the propagation loss accumulates and the insertion loss increases as it passes through the ring resonator that many times, and thus a trade off state such that the output of the light source becomes difficult to be obtained arises. Thus, the design is required to be made at a necessity minimum finesse, and it is important to reliably coincide the central frequencies of the three ring resonators in the multiple-optical resonator to obtain an optimum magnitude for the mode gain difference.

SUMMARY OF THE INVENTION

It is an exemplary object of the invention to provide a tunable light source apparatus including a multiple-optical resonator, where the central frequencies of the respective optical resonators in the multiple-optical resonator are exactly coincided with the set frequency to obtain an optimum magnitude for the mode gain difference, and the frequency of the output laser light is locked within a range of about 1 GHz from the set frequency.

In order to achieve the above object, a tunable light source apparatus according to an exemplary aspect of the invention relates to a tunable light source apparatus including an optical resonator filter including a multiple-optical resonator in which a plurality of optical resonators with different light path lengths is connected; a light supply device for supplying light to the optical resonator filter; a tunable device for changing a resonance wavelength of the multiple-optical resonator; a first light detection device for detecting an oscillation light output to outside from an output port of the optical resonator filter; a second light detection device for detecting a light deviated from a resonator path of the optical resonator filter output from a through port of the optical resonator filter; and a control unit for controlling the operation of the tunable device based on the lights detected by the first and the second light detection device.

A wavelength variable light source apparatus control method according to another exemplary aspect of the invention relates to a light source wavelength adjustment method including the steps of supplying light into an optical resonator filter from a light supply device; detecting an oscillation light output outside from an output port of the optical resonator filter and detecting a light deviated from a resonator path in the optical resonator filter from a through port of the optical resonator filter; and controlling the operation of a tunable device based on each detected light.

DETAILED DESCRIPTION OF THE EXEMPLARY EMBODIMENTS

One exemplary embodiment of the present invention will now be described with reference to the drawings.

Figure 1:
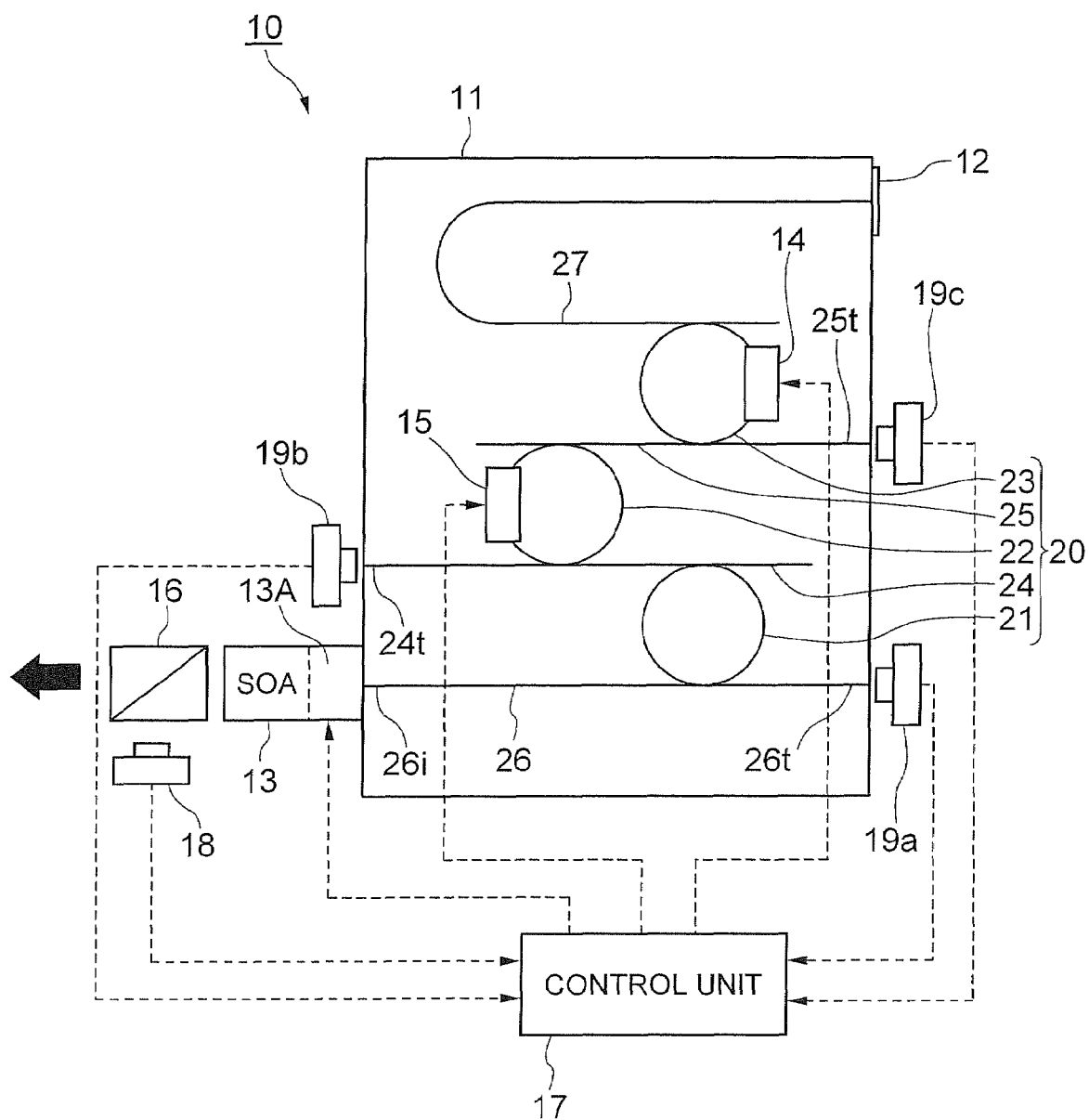
FIG. 1 is a plan view showing a configuration of a tunable light source apparatus according to one exemplary embodiment of the invention.

FIG. 1 is a plan view showing a tunable light source apparatus 10 of the exemplary embodiment.

As shown in FIG. 1, the tunable light source apparatus 10 of the exemplary embodiment includes an optical resonator filter 11, or a PLC (Planar Lightwave Circuit), configured by forming a multiple-optical resonator 20 in which ring resonators 21, 22, and 23 with different light path lengths are connected via waveguides 24, 25, an input/output side optical waveguide 26 on the side for inputting/outputting the laser light, and a reflection side optical waveguide 27 including a light reflection film 12 arranged on one end; and an SOA (Semiconductor Optical Amplifier) 13 serving as a light supply device connected to a light input/output port 26i of the optical resonator filter 11.

Furthermore, the tunable light source apparatus 10 of the exemplary embodiment is configured including TO phase shifters 14 and 15 serving as tunable device for changing the resonance wavelength in the multiple-optical resonator 20; a prism coupler 16 for reflecting the light quantity of about one tenth of the incident light in the direction which is turned by 90 degrees; a light receiving element 18 serving as a first light detection device for detecting the oscillation light resonated by the multiple-optical resonator 20 and output to the outside from the input/output port 26i; and light receiving elements 19a, 19b, and 19c serving as second light detection device for detecting light from through ports 26t, 24t, and 25t deviated from the resonator path in the optical resonator filter 11; and further includes a control unit 17 for controlling application powers to the TO phase shifters 14 and 15 based on the light detected by the light receiving elements 18, 19a, 19b, and 19c.

As shown in FIG. 1, the optical resonator filter 11 is a PLC substrate configured so that the multiple-optical resonator 20 is arranged between the input/output side waveguide 26 and the reflection side waveguide 27. The ring resonators 21, 22, and 23 and the light waveguides 24, 25, 26, and 27 in the PLC substrate are formed with quartz glass waveguide etc. in which quartz glass is deposited on a silicon substrate or glass substrate.

The multiple-optical resonator 20 is formed by connecting in series the ring resonators 21, 22, and 23 in which the light path length represented by the product of the refractive index of a medium through which the light propagates and the geometrical length differs from each other. The multiple-optical resonator 20 combines and splits the light of resonance wavelength only when the ring resonators 21, 22, and 23 are simultaneously resonating, so that a large FSR (Free Spectral Range) is obtained by a Vernier effect.

Vernier effect is a phenomenon where when a plurality of resonators having different light path lengths is combined, the resonance frequency of each resonator in which the peak period is shifted overlaps at the frequency of least common multiple thereof. The multiple-optical resonator in which the plurality of resonators are combined utilizes the Vernier effect so that the apparent FSR becomes the frequency of least common multiple of the resonance frequencies of the respective resonators. The characteristics of the frequency then can be controlled in a wider range than with a single resonator.

The structure of the tunable light source apparatus 10 uses the wavelength transmission characteristics of each drop port of the ring resonators 21, 22, and 23 to select the resonance mode and perform the single mode oscillation. According to the design of slightly differing the light path lengths of the ring resonators 21, 22, and 23 of three stages configuring the multiple-optical resonator 20, the respective resonance wavelengths coincide at only one location even in a wide wavelength range of a few dozen nm, and the single mode oscillation occurs at such coinciding wavelength.

In the optical resonator filter 11 according to the exemplary embodiment, the resonance wavelength in the multiple-optical resonator 20, which is the wavelength of least common multiple of the respective resonance wavelengths of the ring resonators 21, 22, and 23, is set as the wavelength on the ITU-Grid by fixing the FSR of the ring resonator 21 on the ITU-Grid. In the multiple-optical resonator 20, the ring resonator 21 is provided for ITU-Grid fixation, the ring resonator 22 is provided for fine tuning, and the ring resonator 23 is provided for coarse tuning.

The TO phase shifters 14 and 15 shown in FIG. 1 are mounted on the optical resonator filter 11 in correspondence to the position of the ring shaped waveguide of the ring resonators 22 and 23. The refractive index of the ring shaped waveguides of the ring resonators 22 and 23 using glass or compound semiconductor changes according to temperature. Therefore, the TO shift shifters 14 and 15 individually changes the refractive index of the waveguide through application of heat to the ring shaped waveguides of the ring resonators 22 and 23 to change the respective light path lengths of the ring resonators 22 and 23 and change the resonance wavelength in the multiple-optical resonator 20.

In the tunable light source apparatus 10 of the exemplary embodiment, a film heater made of aluminum film, which is vapor deposited on a position corresponding to the ring resonators 22 and 23 of the optical resonator filter 11, may be arranged as the TO phase shifters 14 and 15. The light path lengths of the ring resonators 22 and 23 are controlled with thermooptical effect by the TO phase shifters 14 and 15. The resonance wavelength in the multiple-optical resonator 20 can be changed by variable controlling the light path lengths of the ring resonators 22 and 23 simultaneously.

Figure 2:
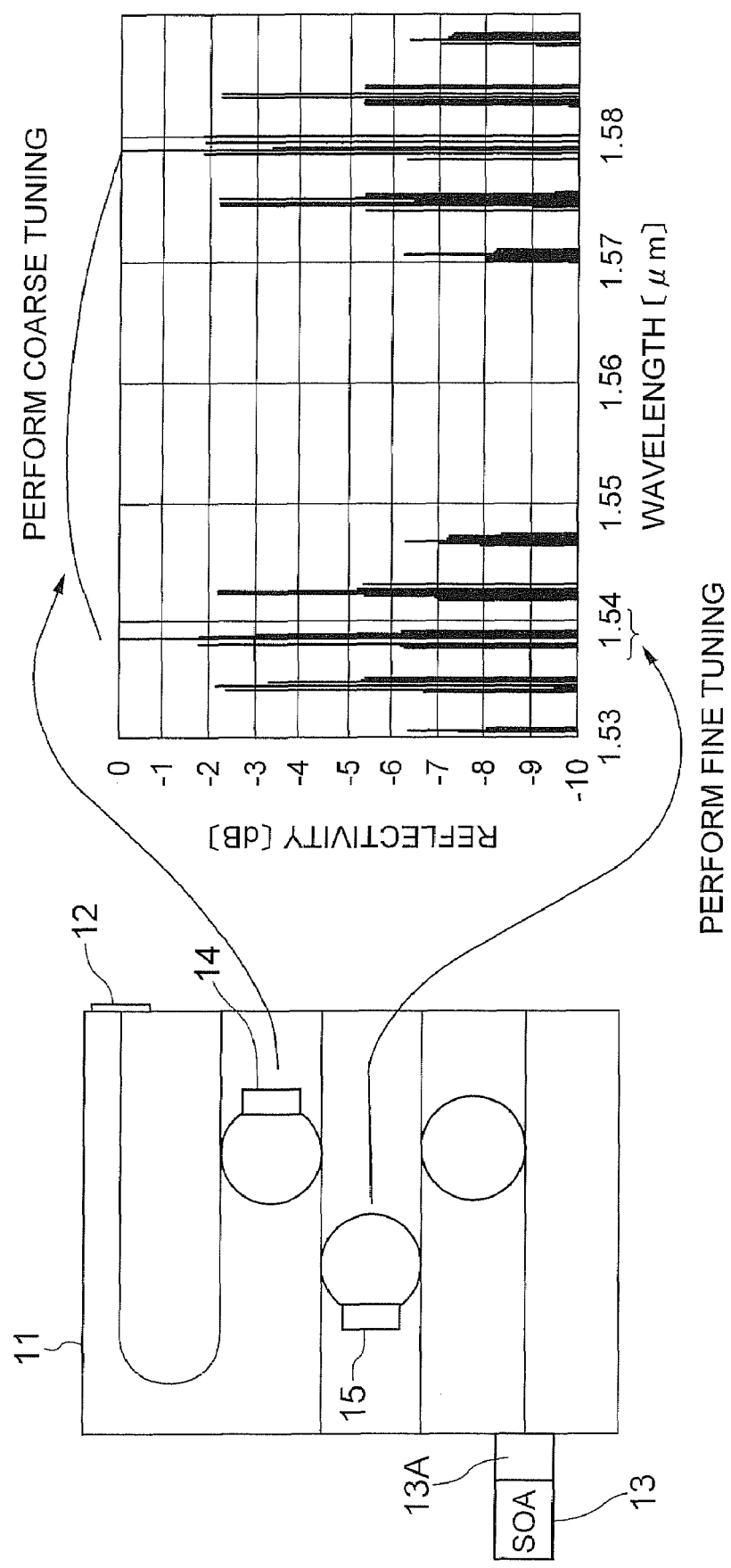
FIG. 2 is a view showing wavelength response characteristics of a multiple-optical resonator according to the exemplary embodiment described in FIG. 1.

FIG. 2 is a view showing wavelength response characteristics of the multiple-optical resonator 20 seen from the SOA 13 side. In this case, the TO phase shifter 14 is provided as a tunable device for coarse tuning, and the TO phase shifter 15 is provided as a tunable device for fine tuning.

The SOA 13 has the end face on the optical resonator filter 11 side, which is performed with AR coating, and the external output side end face, opposite thereto, a reflectivity of which is set to be higher than the AR coated end face on the opposite side by about 1 to 20%. The SOA 13 includes a phase control region 13A, where the wavelength of the light exit from the SOA 13 is changed by controlling the phase current carried to the phase control region 13A. Thus, adjustment is made so that the phases at the surface on the optical resonator filter 11 side of the SOA 13 and the high reflection film 12 coincide, and the insertion loss of the filter can be suppressed. In the exemplary embodiment, the SOA 13 is used as the light supply device, but is not limited thereto, and an optical amplifier such as optical fiber amplifier, light source such as semiconductor laser, and the like may be used.

The light receiving elements 18, 19a, 19b, and 19c are photodiodes. The light receiving element 18 is arranged at a position of receiving, through the prism coupler 16, the laser beam which is oscillated in single mode by the optical resonator filter 11 and output from the external output side end face of the SOA 13.

The light receiving elements 19a, 19b, and 19c are arranged at positions of receiving the light deviated from the resonator path in the optical resonator filter 11, where the light receiving element 19a receives the light from the through port 26t, which is leaked out without entering the ring resonator 21 from the SOA 13, the light receiving element 19b receives the light from the through port 24t, which is leaked out without entering the ring resonator 22 from the SOA 13, and the light receiving element 19c receives the light from the through port 25t, which is leaked out without entering the ring resonator 23 from the SOA 13.

The light receiving elements 18, 19a, 19b, and 19c are connected to the control unit 17. The high reflection film 12 is formed by vapor depositing or laminating a dielectric multilayer film on the side surface of the PLC substrate corresponding to one end of the reflection side waveguide 27.

Figure 3:
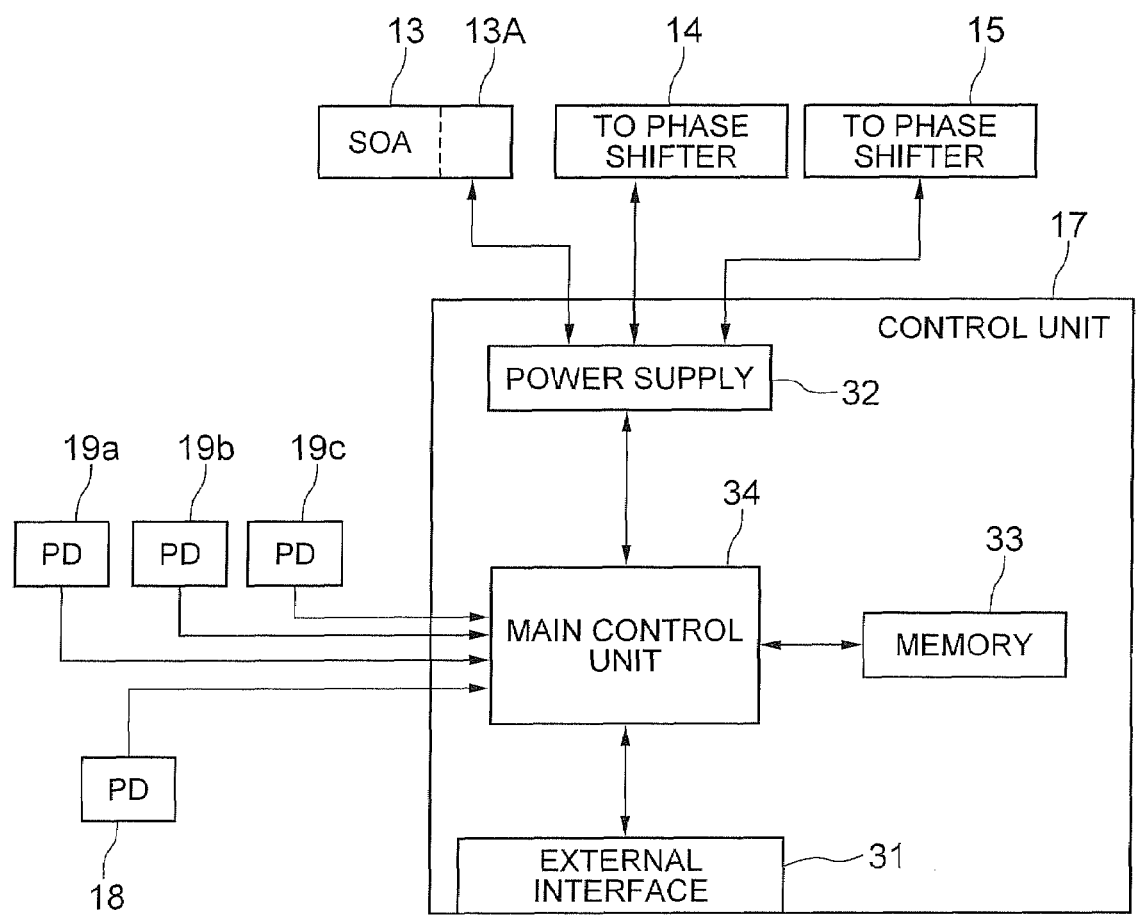
FIG. 3 is a block diagrams showing a configuration of a control unit according to the exemplary embodiment described in FIG. 1.

FIG. 3 is a block diagram showing a configuration of the control unit 17 in the exemplary embodiment.

As shown in FIG. 3, the control unit 17 includes an external interface 31 connected to an external device to retrieve information indicating the desired wavelength channel value of the user from the outside; a power supply 32 for supplying powers to the SOA 13 and the TO phase shifters 14 and 15; a memory 33 for storing input power values to the TO phase shifters 14 and 15 to set the resonance wavelength in the multiple-optical resonator 20 to the wavelength channel defined as the ITU-Grid for each wavelength channel; and a main control unit 34 for controlling the operation of the control unit 17.

The main control unit 34 has a function of specifying the power value to be input to the TO phase shifters 14 and 15 from the information stored in the memory 33 based on the value of the set wavelength channel input through the external interface 31, and instructing the power supply 32 to supply powers to the TO phase shifters 14 and 15; and a function of instructing the power supply 32 to supply power to the SOA 13 and causing the SOA 13 to supply light towards the optical resonator filter 11 side.

The main control unit 34 further has a function of acquiring the value of each output light levels detected in the light receiving elements 18, 19a, 19b, and 19c, adjusting the input power amount to the phase control region 13A and the TO phase shifters 14 and 15 based on each output light level, and performing a control to oscillate the laser beam of stable wavelength.

When the light receiving levels of the light receiving elements 19a, 19b, and 19c become large, this means that great amount of light is leaking from the multiple-optical resonator 20, and the level of the laser oscillation light is decreasing. On the other hand, the light receiving levels of the light receiving elements 19a, 19b, and 19c decrease under a condition in which a stable laser oscillation light output is obtained and the light receiving level of the light receiving element 18 becomes large. Thus, since the light receiving characteristic in the light receiving element 18 and the light receiving characteristic in the light receiving elements 19a, 19b, and 19c are opposite, the laser beam of stable wavelength can be oscillated by adjusting the light path lengths of the ring resonators 22 and 23 so as to minimize the light receiving levels of the light receiving elements 19a, 19b, and 19c and maximize the light receiving level of the light receiving element 18.

Unless the phase of the light circling in the optical resonator filter 11 coincides at the side surface of the optical resonator filter 11 of the SOA 13 and the high reflection film 12, the insertion loss of the filter appears to increase. Accordingly, the phase current to be supplied to the phase control region 13A in the SOA 13 needs to be adjusted to alleviate the insertion loss of the filter. Thus, in the tunable light source apparatus 10 of the exemplary embodiment, the light path length of the entire optical resonator filter 11 also needs to be adjusted with the light path lengths of the ring resonators 22 and 23.

The main control unit 34 has a function of instructing the power supply 32 to individually control the input power amount to the TO phase shifters 14 and 15 until the SOA phase current value at which the light output detected in the light receiving elements 19a, 19b and 19c becomes a minimum value and the SOA phase current value at which the light output detected in the light receiving element 18 becomes a maximum value are matched. Specifically, the input powers to the TO phase shifters 14 and 15 is fixed firstly, and input power to the phase control region 13A is adjusted so that the light receiving level of the light receiving element 18 exhibits a maximum value. Thereafter, the input powers to the TO phase shifters 14 and 15 is adjusted until the light receiving levels of the light receiving elements 19a, 19b, and 19c exhibits a minimum value, and the input power to the phase control region 13A is adjusted so that the light receiving level of the light receiving element 18 exhibits a maximum value in the TO phase condition at this stage. Such processes are repeated to detect the optimum points of the input power amount to the phase control region 13A and the TO phase shifters 14 and 15.

Figure 4A:
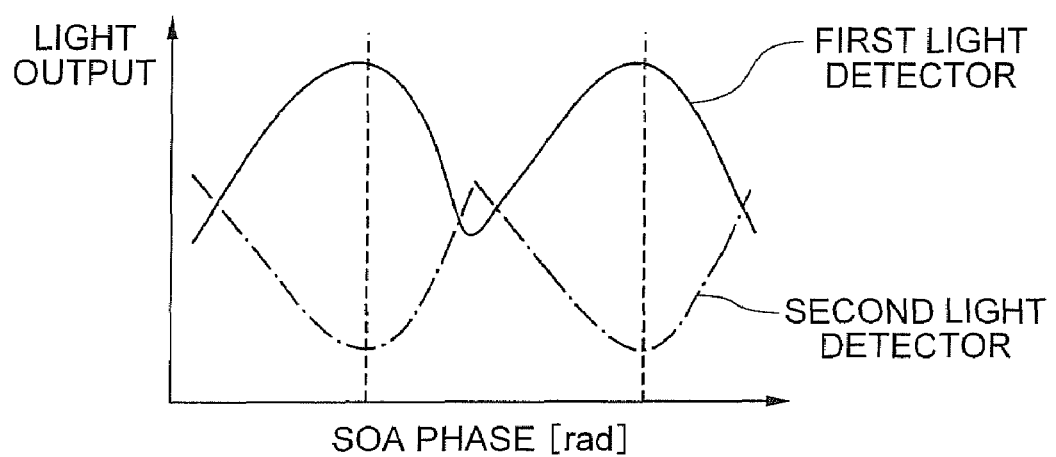
FIGS. 4A and 4B are views showing examples of SOA phase characteristics of an output light level detected by the light receiving elements in the exemplary embodiment described in FIG. 1.
Figure 4B:
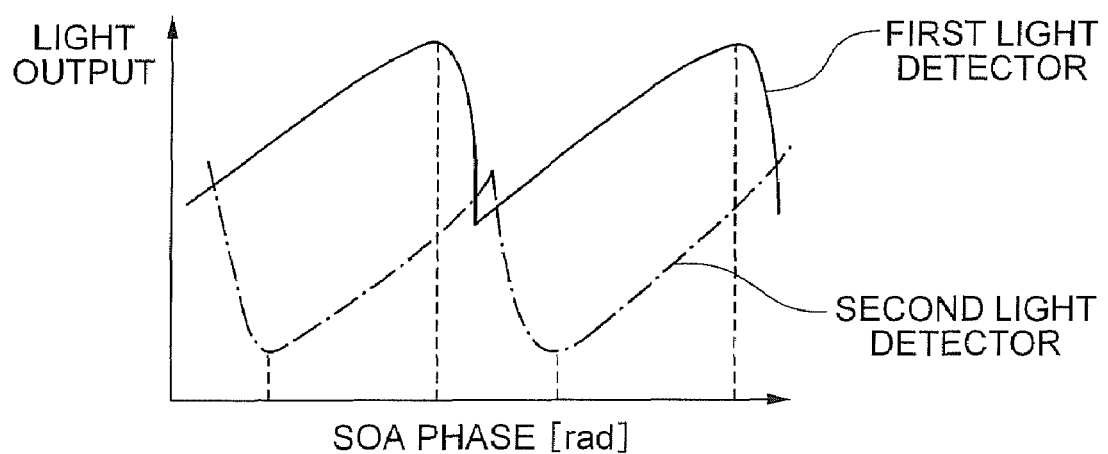

FIG. 4A is a graph showing a state in which the SOA phase current at which the light output levels from the through ports 26t, 24t, and 25t become a minimum value and the SOA phase current value at which the light output level from the input/output port 26i becomes a maximum value are matched. FIG. 4B shows a state in which the SOA phase currents are not matched. The main control unit 34 repeats the above processes until the light receiving characteristics in the light receiving elements 18, 19a, 19b, and 19c become the characteristics shown in FIG. 4A.

The main control unit 34 has a function of storing the input powers to the TO phase shifters 14 and 15 with which the SOA phase current value at which the light output detected in the light receiving elements 19a, 19b, and 19c becomes a minimum value and the SOA phase current value at which the light output detected by the light receiving element 18 becomes a maximum value are matched in the memory 33 as phase control amount data, and instructing the power supply 32 to supply the power indicated by the phase control amount data to the TO phase shifters 14 and 15 in the next phase control.

The TO phase shifters 14 and 15 are not controlled by using only one of the light receiving elements 19a, 19b, and 19c serving as the second light detector because the light output from the through ports 26t, 24t, and 25t is a leakage light that did not enter the ring resonators 21, 22, and 23, and thus, with only one of the light receiving elements 19a, 19b, and 19c, it can be detected only whether or not one of the ring resonators 21, 22, and 23 is coinciding with another filter in central frequency.

For instance, at the detected light level of the light receiving element 19b, it can be recognized only whether or not the central frequency in the fine tuning ring resonator 22 is coinciding with the resonance frequency of other ring resonators 21, 23, and whether or not the central frequencies of the respective other ring resonators 21, 23 are coinciding cannot be recognized, and for example in the figure, it can be recognized only whether or not the fine tuning ring is coinciding with the other filters in central frequency in the second light detector of the fine tuning ring resonator.

The phenomenon that occurs will be described with reference to the drawings in order to more specifically describe the reasons why the optimum TO condition cannot be detected with only one of the light receiving elements 19a, 19b, and 19c serving as the second light detector.

Figure 6:
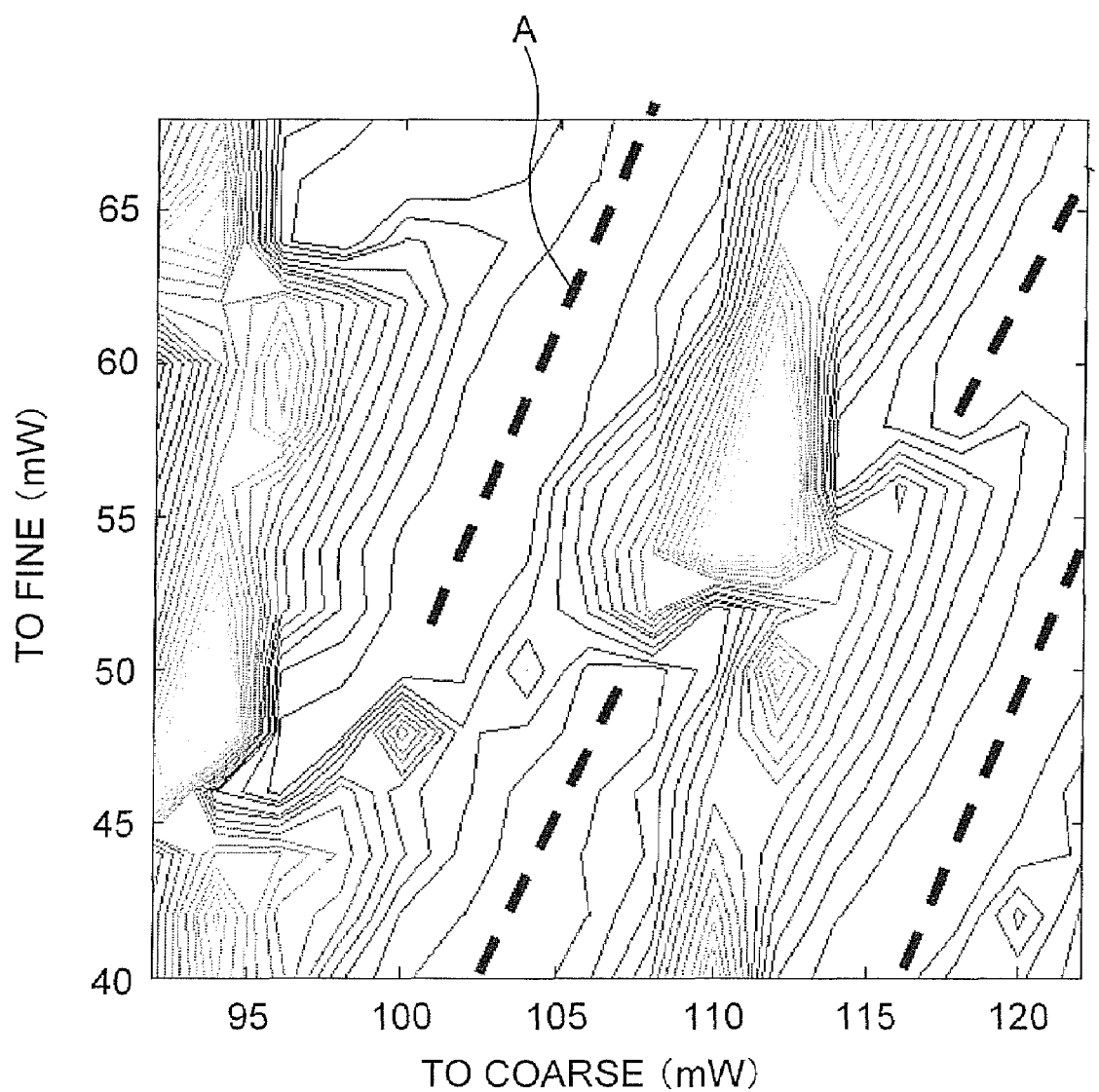
FIG. 6 is a view showing TO tolerance of a light receiving element for detecting light that did not enter a coarse tuning ring resonator according to the exemplary embodiment described in FIG. 1.
Figure 7:
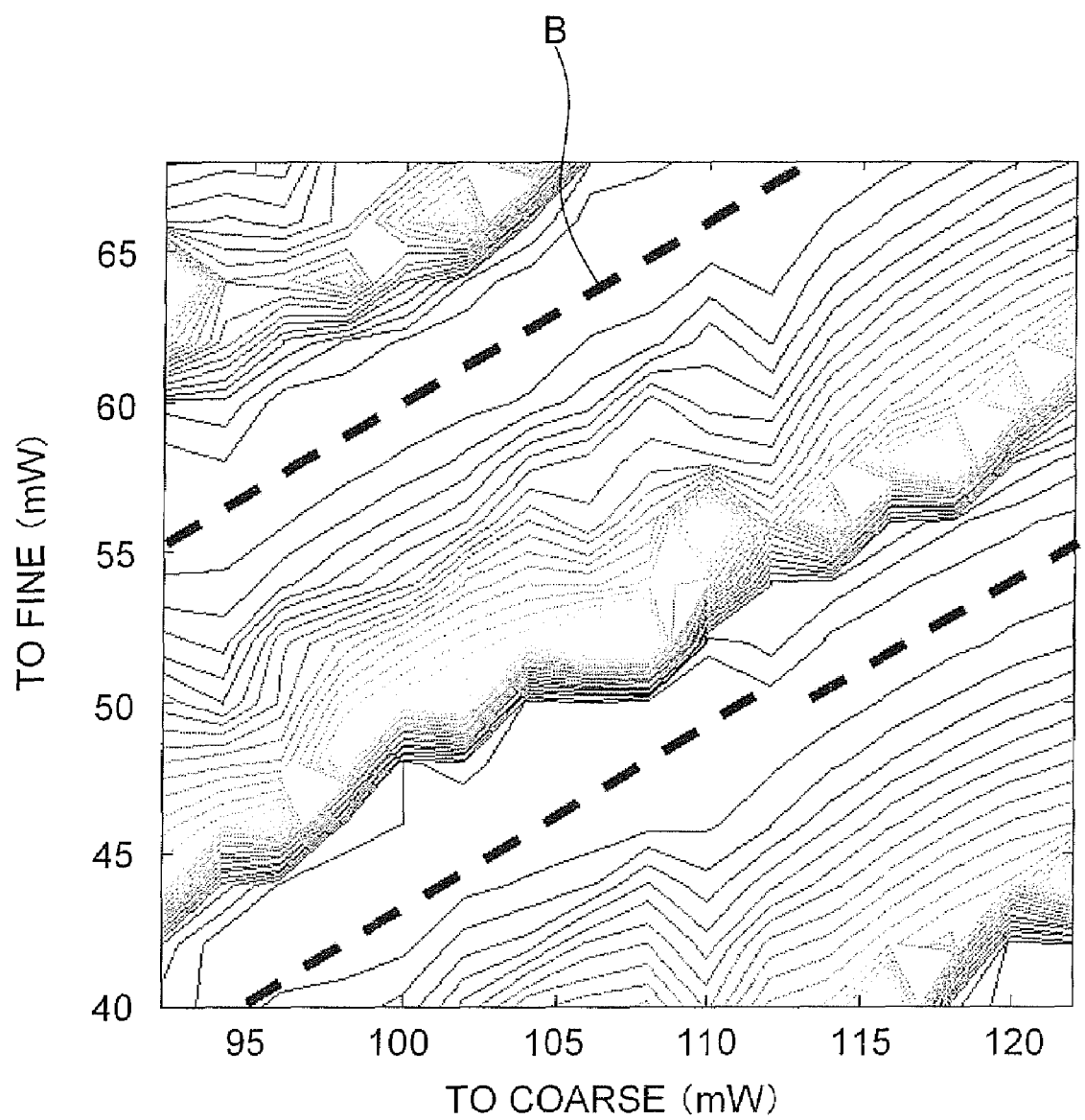
FIG. 7 is a view showing TO tolerance of a light receiving element for detecting light that did not enter a fine tuning ring resonator according to the exemplary embodiment described in FIG. 1.
Figure 8:
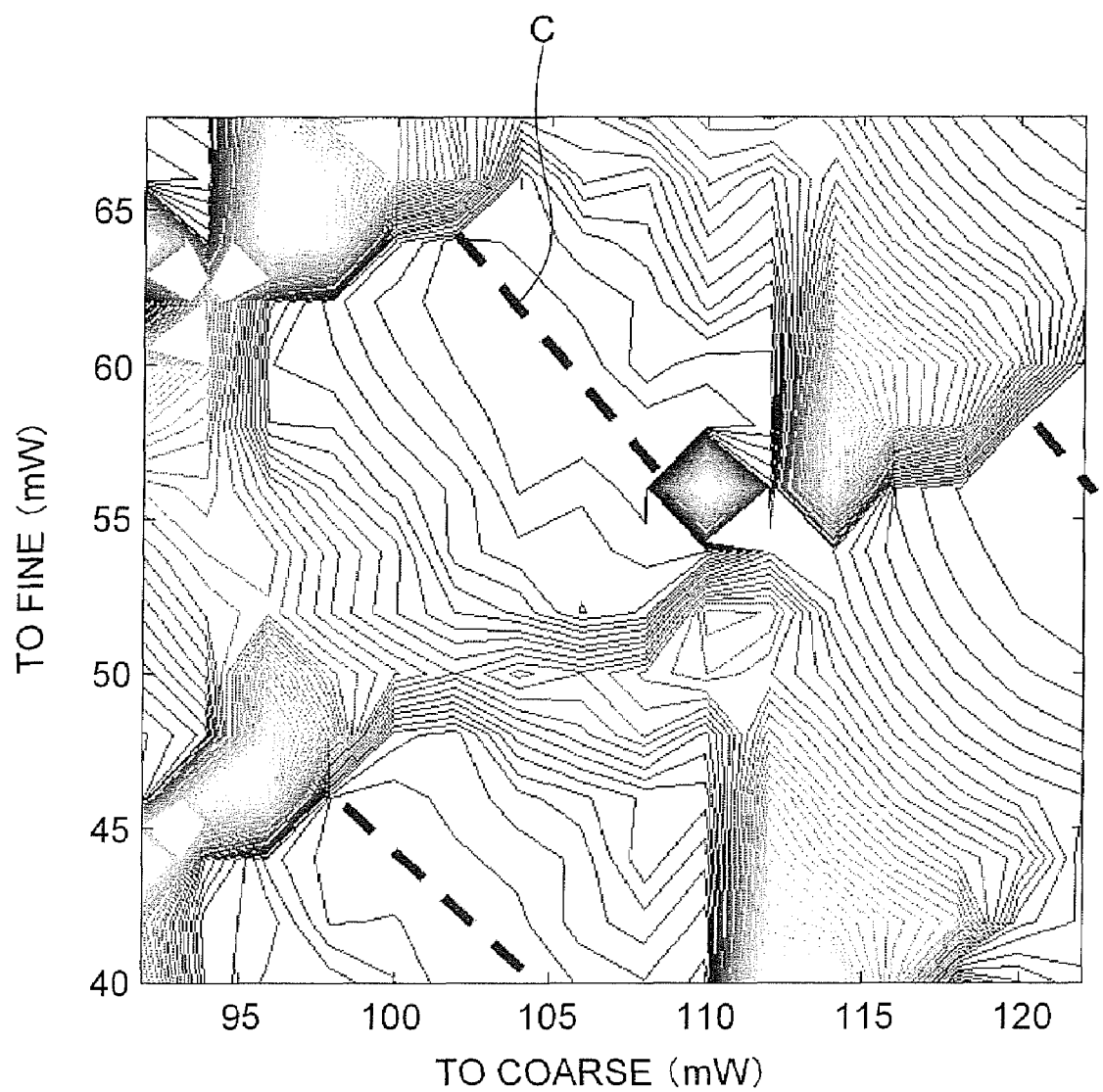
FIG. 8 is a view showing TO tolerance of a light receiving element for detecting light that did not enter an ITU-Grid fixing ring resonator according to the exemplary embodiment described in FIG. 1.

FIGS. 6 to 8 are views showing TO tolerance of the respective light receiving elements 19c, 19b, 19a, where X axis indicates the input power to the TO phase shifter 15 corresponding to the coarse tuning ring resonator 22, and Y axis indicates the input power to the TO phase shifter 14 corresponding to the fine tuning ring resonator 23. A case where the entire phase is adapted to an optimum point is shown throughout FIGS. 6 to 8.

FIG. 6 is a view showing a TO tolerance of the light receiving element 19c for detecting the light from the through port 24t corresponding to the coarse tuning ring resonator 23, and shows the detected light level at the light receiving element 19c in a contour line. As shown in FIG. 6, the minimum condition of the detected light level is represented with a dotted line A that strongly reacts to the X axis. Thus, the optimum point of the TO condition cannot be detected with only the light receiving element 19c.

FIG. 7 is a view showing a TO tolerance of the light receiving element 19b for detecting the light from the through port 24t corresponding to the fine tuning ring resonator 22, and shows the detected light level at the light receiving element 19b in a contour line. As shown in FIG. 7, the minimum condition of the detected light level is represented with a dotted line B. Thus, the optimum point of the TO condition cannot be detected with only the light receiving element 19b.

FIG. 8 is a view showing a TO tolerance of the light receiving element 19a for detecting the light from the through port 26t corresponding to the ring resonator 21, or the reference ring, and shows the detected light level at the light receiving element 19a in a contour line. As shown in FIG. 8, the minimum condition of the detected light level in this case is represented with a dotted line C, and although an axis is not present, reacts to a case where the reference ring and other two rings simultaneously shift. A case in which the rings simultaneously shift is a case where two rings shift by the same amount, or a case where Tofine and TOcoarse decrease or increase by the same amount in FIG. 8.

Figure 9:
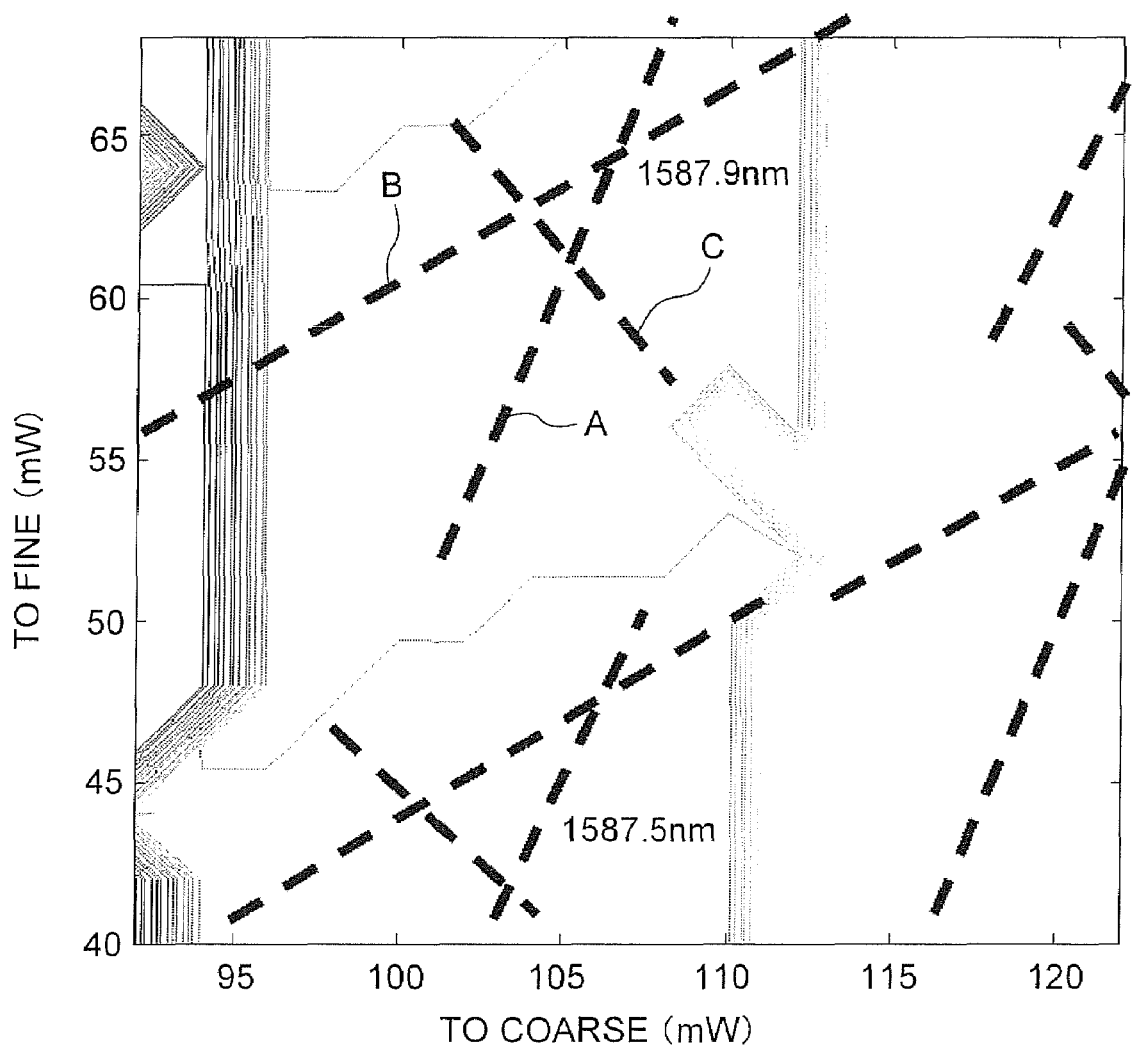
FIG. 9 is a view showing TO tolerance of an output wavelength of the oscillation light in the exemplary embodiment described in FIG. 1.
Figure 10:
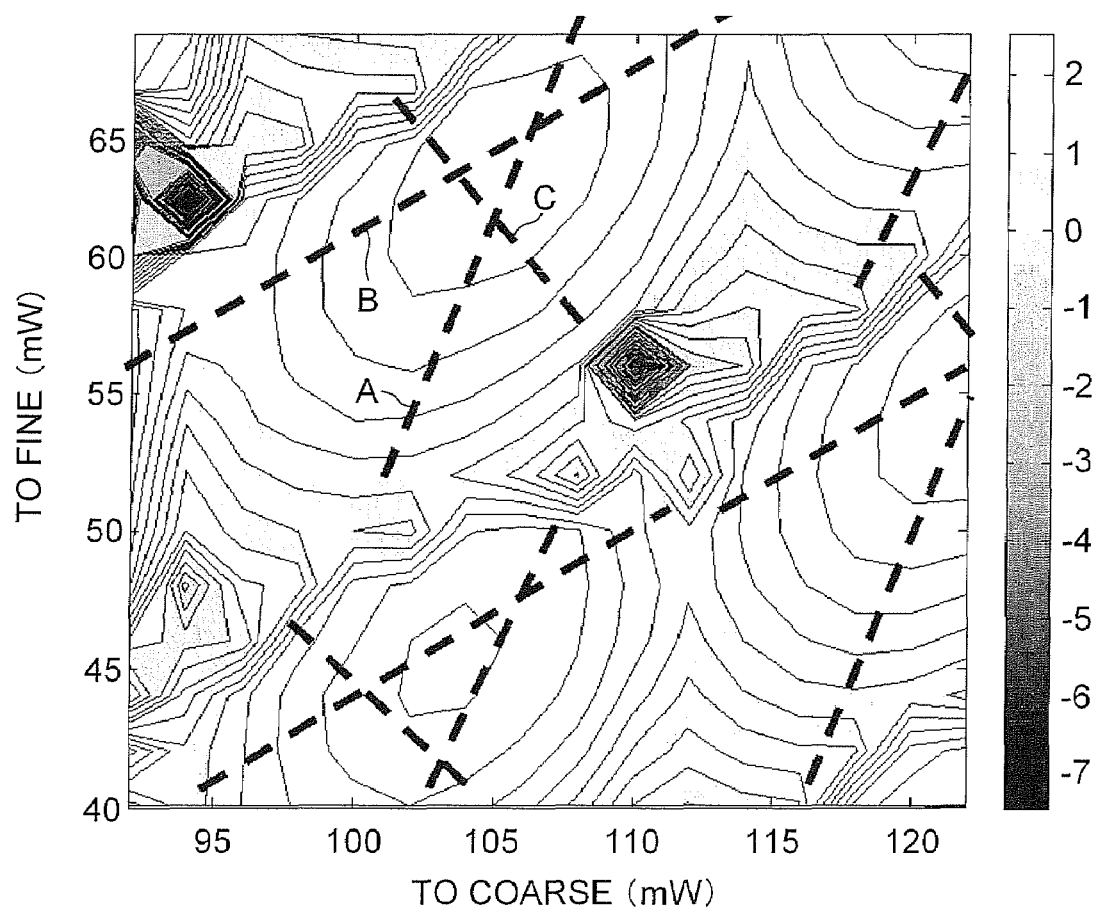
FIG. 10 is a view showing TO tolerance of a light receiving element for detecting the oscillation light in the exemplary embodiment described in FIG. 1.

FIG. 9 is obtained when the three optimum lines A, B, C are overlapped in the wavelength region, and FIG. 10 is obtained when the lines are overlapped in the TO tolerance of the light receiving element 18. A triangular region defined by the three optimum lines A, B, C shown in FIG. 9 is a stable operational condition, where the oscillation light output maximum condition exists in the triangular region defined by the three optimum lines A, B, C, and the light output characteristic exactly matches the detection result in the first light detection device as shown in FIG. 10.

The three optimum lines do not coincide at one point as in FIGS. 9 and 10 because the effective light filter characteristics deviate from the ideal filter characteristics since a ring resonator propagation loss is present and the light output gradually decreases. The size of the triangular region becomes smaller, and concentrates at one point, as the propagation loss in the optical resonator filter 11 becomes smaller. The sizes of the triangular region of channel of 1587.9 nm and the triangular region of the channel of 1587.5 nm of FIG. 9 slightly differ due to influence of channel dependency of the filter loss.

Since the optical resonator filter 11 presents such light filter characteristics, the control unit 17 individually controls the current-flow amount of the TO phase shifters 14 and 15 until the values of the SOA phase currents at the time when the detection light intensity of the light receiving element 18 is maximum and at the time when the light detection light intensity of the light receiving elements 19a, 19b and 19c is minimum are matched, and controls the phases of the ring resonators 22 and 23 to easily search for the optimum conditions.

Therefore, only an optimum line can be detected, and an optimum point cannot be detected, with only one of the light receiving elements 19a, 19b and 19c. To detect the optimum condition, either one of the light receiving elements 19a, 19b and 19c and the light receiving element 18 are required to be used, or, two of the light receiving elements 19a, 19b and 19c are required to be used. Thus, the light receiving elements 18, 19a, 19b and 19c are used in the exemplary embodiment.

The function content of the main control unit 34 can be programmed to be executed by the computer.

In the wavelength variable light source apparatus 10 of the exemplary embodiment, the ASE light emitted from the SOA 13 returns through a path of SOA 13→input/output side waveguide 26→multiple-optical resonator 20→reflection side waveguide 27→high reflection film 12→reflection side waveguide 27→multiple-optical resonator 20→input/output side waveguide 26→SOA 13.

Each ring resonator 21, 22, and 23 configuring the multiple-optical resonator 20 has different FSR, where greater reflection or transmittance occurs at the wavelength on which the periodic change of reflection or transmittance generated in the ring resonator 21, 22, and 23 coincide, and thus the returning light reflected by the high reflection film 12 from the SOA 13 becomes the strongest at the resonance wavelength of the multiple-optical resonator 20.

In the tunable light source apparatus 10 of such exemplary embodiment, the light receiving element 18 receives the laser beam from the input/output port 26i, and the light receiving elements 19a, 19b, and 19c receive the light from the through ports 26t, 24t, and 25t. The control unit 17 controls the input powers to the TO phase shifters 14 and 15 formed on the ring resonators 22 and 23 based on the light receiving levels. Thus, the oscillation laser light becomes more stable.

The operation of the tunable light source apparatus 10 of the exemplary embodiment will now be described. The control method of the tunable light source apparatus according to the present invention will be simultaneously described showing each step.

Figure 5:
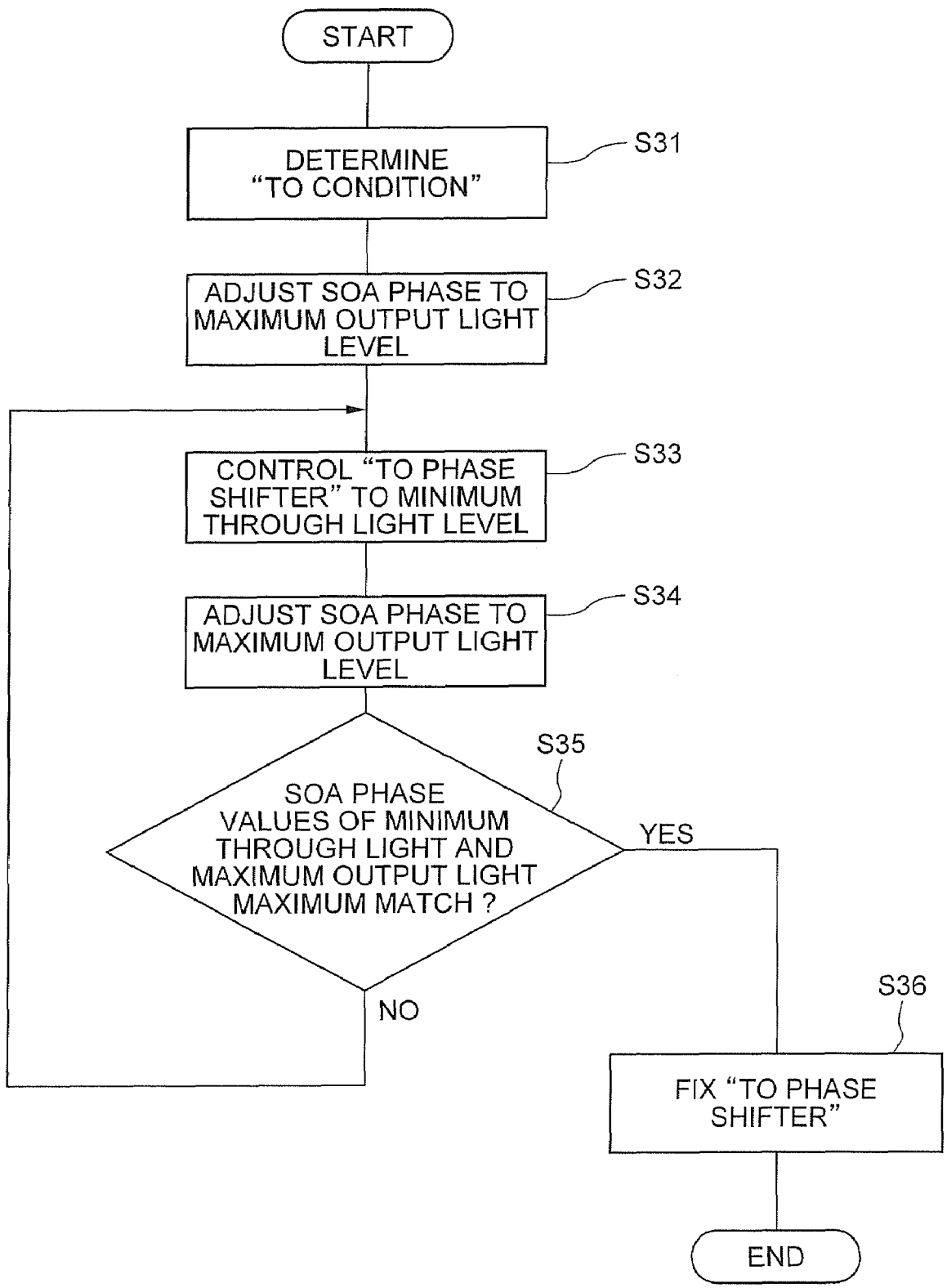
FIG. 5 is a flowchart showing operation of the control unit according to the exemplary embodiment described in FIG. 1.

FIG. 5 is a flowchart showing the operation of the control unit 17 according to the exemplary embodiment.

In the tunable light source apparatus 10, firstly, the power corresponding to the wavelength channel set by external input is supplied to the TO phase shifters 14 and 15 and the light path lengths of the ring resonators 22 and 23 are fixed by the control unit 17. Then, the ASE light is output from the SOA 13 (light supply step). The ASE light enters the input/output side waveguide 26 from the input/output port, and is propagated through the multiple-optical resonator 20 and reflected by the high reflection film 12, and again propagated through the multiple-optical resonator 20, and exit from the end face of the SOA 13. The multiple-optical resonator 20 thereby serves as a laser resonator, and the laser beam is oscillated from the tunable light source apparatus 10.

In this case, the light output from the input/output port 26i and the light output from the through ports 26t, 24t, 25t are detected by the light receiving elements 18, 19a, 19b, and 19c (light detection step). The power is supplied to the TO phase shifters 14 and 15 based on the light received amount detected by the light receiving elements 18, 19a, 19b, and 19c, thereby tuning control of the phases of the ring resonators 22 and 23 is performed (tuning control step).

Specifically, the control unit 17 fixes the input powers to the TO phase shifters 14 and 15 first (FIG. 5: step S31), acquires the output light levels detected by the light receiving elements 18, 19a, 19b, and 19c, and adjusts the power input to the phase control region 13A so that the light receiving level of the light receiving element 18 takes a maximum value (FIG. 5: step S32). Thereafter, the control unit 17 adjusts the powers input to the TO phase shifters 14 and 15 until the light receiving levels of the light receiving elements 19a, 19b, and 19c take a minimum value (FIG. 5: step S33), and adjusts the power input to the phase control region 13A so that the light receiving level of the light receiving element 18 takes a maximum value in the TO phase condition of this stage (FIG. 5: step S34).

As a result of repeating the above, if the SOA phase current value at which the levels of the light output from the through ports 26t, 24t and 25t detected in the light receiving elements 19a, 19b and 19c become a minimum value and the SOA phase current value at which the level of the light output from the input/output port 26i detected in the light receiving element 18 becomes a maximum value are matched, then the central frequencies of the ring resonators 21, 22, and 23 are matched, and thus the control unit 17 fixes the powers input to the TO phase shifters 14 and 15 to maintain the relevant state (FIG. 5: step S36).

If the SOA phase current value at which the light output levels detected in the light receiving elements 19a, 19b and 19c become a minimum value and the SOA phase current value at which the light output level detected in the light receiving element 18 becomes a maximum value are not matched, the control unit 17 changes the powers input to the TO phase shifters 14 and 15, and tuning controls the light path lengths of the ring resonators 22 and 23 until the SOA phase current values are matched.

The graph showing one example of the SOA phase characteristic of each output light level is shown in FIGS. 4A and 4B. FIG. 4A is a graph showing a state in which the SOA phase current at which the level of the light output from the through port becomes a minimum value and the SOA phase current value at which the level of the light output from the input/output port becomes a maximum value are matched. FIG. 4B shows a state in which the SOA phase currents are not matched. In the exemplary embodiment, the light path lengths of the ring resonators 22 and 23 are tunably controlled until the measurement result of FIG. 4A is obtained.

Figure 11:
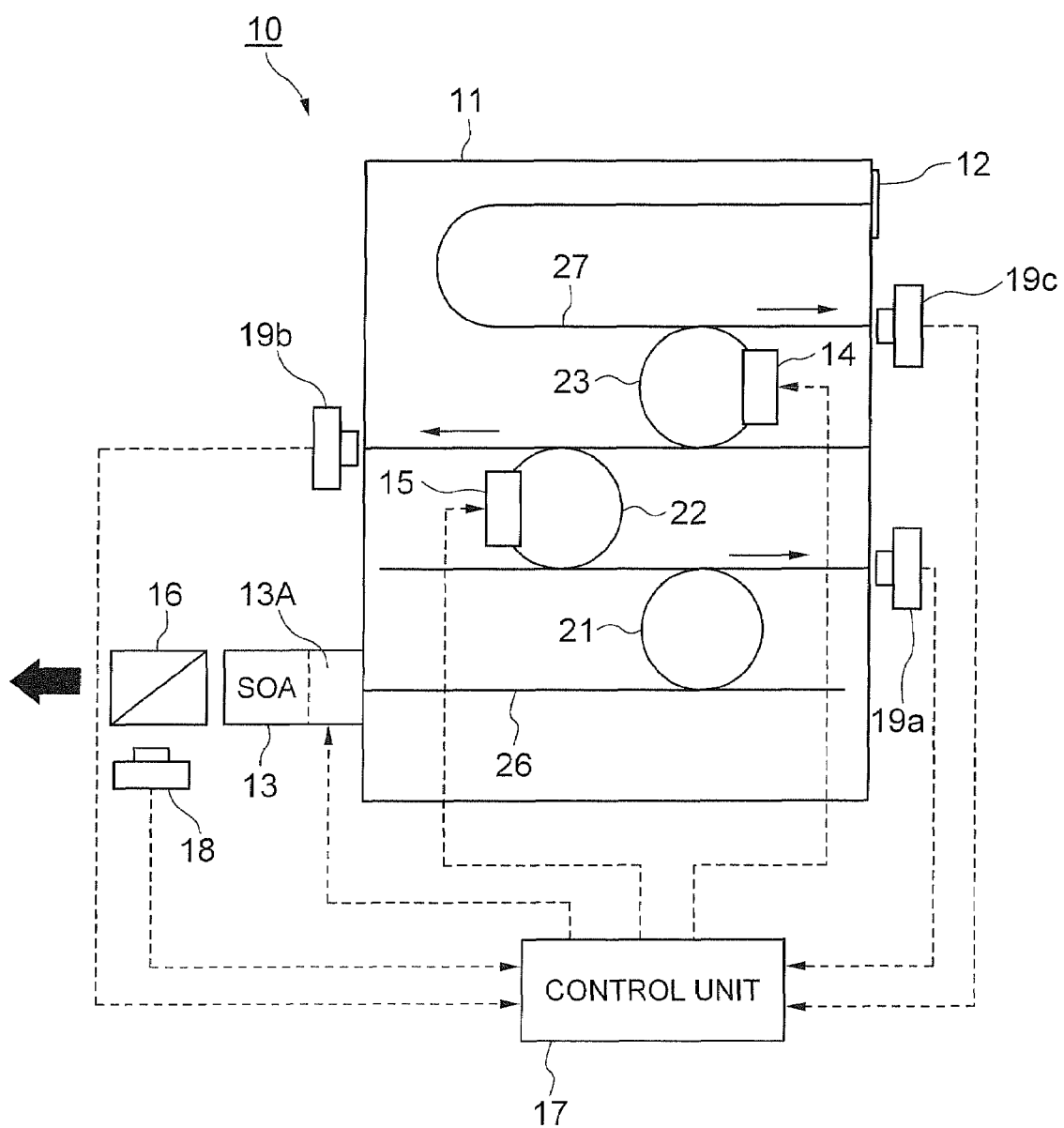
FIG. 11 is a plan view showing another example of a configuration of the tunable light source apparatus according to the exemplary embodiment described in FIG. 1.

In the exemplary embodiment, the light receiving elements 19a, 19b, and 19c are mounted at positions of detecting in the middle the leakage of the light in the mid-course from the SOA to the light reflection film 12, as shown in FIG. 1, but is not limited thereto, and may be mounted at positions corresponding to the through ports for outputting the leakage light of the light returning from the light reflection film 12, as shown in FIG. 11.

As described above, in the tunable light source apparatus 10 of the exemplary embodiment, the light receiving elements 19a, 19b and 19c for detecting the light from the through ports 26t, 24t and 25t and the light receiving element 18 for detecting the light from the output port 26i are attached, and the light path lengths of the ring resonators 22 and 23 are tunably controlled in an aim of obtaining a state in which the levels of the light output from the through ports 26t, 24t and 25t are minimum and, at the same time, the level of the light output from the output port 26i is a maximum. Therefore, the central frequencies of the three ring resonators 21, 22, and 23 exactly match the set frequency by obtaining a state in which the resonance loss is a minimum and, at the same time, the oscillation light intensity is a maximum, whereby the laser beam of stable wavelength can be oscillated. The frequency of the laser beam can be locked within a range of about 1 GHz from the set frequency.

The frequency lock control of the exit light in the tunable light source apparatus 10 of the exemplary embodiment is executed based only on the intensity of the light output from the through ports 26t, 24t, and 25t and the output port 26i, and the wavelength component of the output light does not need to be detected, and thus a rapid control can be realized.

As an exemplary advantage according to the invention, the present invention provides a tunable light source apparatus including a multiple-optical resonator, where a control to exactly coincide the central frequency of each optical resonator in the multiple-optical resonator with the set frequency is executed based only on the intensities of the output lights from the through port and the output port, and the frequency of the output laser beam can be locked within a range of about 1 GHz from the set frequency without detecting the wavelength component of the output light.

In the tunable light source apparatus, the control unit described above may have a function of controlling the tunable device so that an intensity of the light detected by the first light detection device takes a minimum value and an intensity of the light detected by the second light detection device takes a maximum value.

Therefore, a stable laser beam with small resonance loss is obtained by adjusting the resonance wavelength of the multiple-optical resonator in an aim of obtaining a state in which the oscillation light intensity becomes a maximum and, at the same time, the intensity of the light from the through port becomes a minimum.

In the tunable light source apparatus, the second light detection device may be arranged in plurals with respect to one through port in correspondence to each optical resonator. The resonance wavelength of the multiple-optical resonator then can be more accurately adjusted.

In the tunable light source apparatus, the tunable device may be configured to individually change the resonance wavelength of each resonator in the multiple-optical resonator. The resonance wavelength of the multiple-optical resonator can be adjusted by changing the resonance wavelength of each resonator of the multiple-optical resonator.

In the tunable light source apparatus, the resonator in the multiple-optical resonator may be a ring resonator. Since the ring resonator is a passive optical component, current injection to the semiconductor laser and mechanically movable member are not used, and thus reliable characteristics are obtained.

In the tunable light source apparatus, the tunable device may be a film shaped heater for changing the light path length of one of the optical resonators. With this, the resonance wavelength of the resonator can be changed based on the temperature characteristic of the waveguide forming the resonator.

In the tunable light source apparatus, the light supply device may be a semiconductor optical amplifier. With this, the light supply device can be very miniaturized.

In the tunable light source apparatus, a planar lightwave circuit may be formed on the same substrate. With this, a precise waveguide pattern can be formed.

In the above, control method, the control unit may control the operation of the tunable device so that an intensity of the output light output from the output port takes a maximum value and, at the same time, an intensity of the light from the through port takes a minimum value, in the tuning step.

According to the control method, a stable laser beam with small resonance loss can be output from the tuning light source apparatus by adjusting the resonance wavelength of the multiple-optical resonator in an aim of obtaining a state in which the oscillation light output becomes a maximum and, at the same time, the light output from the through port becomes a minimum in the tuning light source apparatus including the multiple-optical resonator.

The exemplary embodiment of the invention may be built as a tuning light source apparatus control program. The wavelength variable light source apparatus control program according to the present invention is built to cause a computer for controlling the operation of a tuning light source apparatus including an optical resonator filter with a multiple-optical resonator in which a plurality of optical resonators is connected, a light supply device for supplying light into the filter from the input port of the optical resonator filter, and a tuning device for changing the resonance wavelength of the multiple-optical resonator, to execute a light supply process for instructing the light supply device to supply light into the optical resonator filter, an output light intensity input process for inputting, from a light detection device arranged in advance, intensity data of the light to be output to the outside from an output port of the optical resonator filter, a through light intensity input process for inputting, from a light detection device arranged in advance, the intensity data of the light deviated from the resonator path in the filter to be output from a through port of the optical resonator filter, and a tuning process of controlling the operation of the tuning device based on each intensity data input in the through light intensity input process and the output light intensity input process.

In the tuning light source apparatus control program, the content may be specified to control the operation of the tuning device so that an intensity of the output light output to the outside from the output port takes a maximum value and at the same time an intensity of the light output from the through port takes a minimum value in the tuning process.

According to such program, the stable laser beam with small resonance loss can be output from the tuning light source apparatus by changing the resonance wavelength of the multiple-optical resonator in an aim of obtaining a state in which the oscillation light level becomes a maximum and, at the same time, the level of the light output from the through port becomes a minimum with respect to the tuning light source apparatus including the multiple-optical resonator.

It should be apparent to those skilled in the art that the present invention may be embodied in many other specific forms without departing from the spirit or scope of the invention. Therefore, the present invention is not to be limited to the details given herein, but may be modified within the scope and equivalence of the appended claims.

What is claimed is:

1. A tuning light source apparatus comprising:
an optical resonator filter including a multiple-optical resonator in which a plurality of optical resonators of different light path lengths is connected, the optical resonators comprising:
a first optical resonator positioned at a light input/output side of the optical resonator filter;
a second optical resonator positioned at a reflection side of the optical resonator filter;

a third optical resonator positioned between the first and the second optical resonators;

a light supply device for supplying light to the optical resonator filter at the light input/output side of the optical resonator filter;

a tuning device for changing a resonance wavelength of the multiple-optical resonator;

a first light detection device for detecting an oscillation light output to outside from an output port of the optical resonator filter, the output port located at the light input/output side of the optical resonator filter;

a plurality of additional light detection devices for detecting light deviated from corresponding resonator paths of the optical resonator filter output from corresponding through ports of the optical resonator filter, the additional light detection devices comprising:

a first additional light detection device to detect light deviated from a first resonator path of the optical resonator filter output from a first through port of the optical resonator filter, the first resonator path located at the light input/output side of the optical resonator filter, the first additional light detection device to detect the light output by the light supply device through the first resonator path that does not reach the first, the second, and the third optical resonators;

a second additional light detection device to detect light deviated from a second resonator path of the optical resonator filter output from a second through port of the optical resonator filter, the second resonator path located between the first and the second optical resonators, the second additional light detection device to detect the light output by the light supply device through the first and the second resonator paths and the first optical resonator that does not reach the second and the third optical resonators;

a third additional light detection device to detect light deviated from a third resonator path of the optical resonator filter output from a third through port of the optical resonator filter, the third resonator path located at the reflection side of the optical resonator filter, the third additional light detection device to detect the light output by the light supply device through the first, the second, and the third resonator paths, and the first and the third optical resonators, that does not reach the second optical resonator; and a control unit for controlling the operation of the tuning device based on the lights detected by the first and the additional light detection devices.

2. The tuning light source apparatus according to claim 1, wherein the control unit has a function of controlling the operation of the tuning device so that an intensity of the light detected by the first light detection device takes a maximum value and, at the same time, an intensity of the light detected by one or more of the additional light detection devices takes a minimum value.

3. The tuning light source apparatus according to claim 1, wherein each additional light detection device corresponds to one of the optical resonators.

4. The tuning light source apparatus according to claim 1, wherein the tuning device is configured to individually change a resonance wavelength of each optical resonator in the multiple-optical resonator.

5. The tuning light source apparatus according to claim 1, wherein each optical resonator in the multiple-optical resonator is a ring resonator.

6. The tuning light source apparatus according to claim 1, wherein the tuning device is a film shaped heater for changing a light path length of each optical resonator.

7. The tuning light source apparatus according to claim 1, wherein the light supply device is a semiconductor optical amplifier.

8. The tuning light source apparatus according to claim 1, wherein the optical resonator filter is a planar lightwave circuit.

9. A tuning light source apparatus comprising:

an optical resonator filter including a multiple-optical resonator in which a plurality of optical resonators of different light path lengths is connected, the optical resonators comprising:

a first optical resonator positioned at a light input/output side of the optical resonator filter;

a second optical resonator positioned at a reflection side of the optical resonator filter;

a third optical resonator positioned between the first and the second optical resonators;

a light supply means for supplying light to the optical resonator filter at the light input/output side of the optical resonator filter;

a tuning means for changing a resonance wavelength of the multiple-optical resonator;

a first light detection means for detecting an oscillation light output to outside from an output port of the optical resonator filter;

a plurality of additional light detection means for detecting light deviated from corresponding resonator paths of the optical resonator filter output from corresponding through ports of the optical resonator filter, the additional light detection means comprising:

first additional light detection means for detecting light deviated from a first resonator path of the optical resonator filter output from a first through port of the optical resonator filter, the first resonator path located at the light input/output side of the optical resonator filter, the first additional light detection means to detect the light output by the light supply device through the first resonator path that does not reach the first, the second, and the third optical resonators;

second additional light detection means for detecting light deviated from a second resonator path of the optical resonator filter output from a second through port of the optical resonator filter, the second resonator path located between the first and the second optical resonators, the second additional light detection means to detect the light output by the light supply device through the first and the second resonator paths and the first optical resonator that does not reach the second and the third optical resonators;

third additional light detection means for detecting light deviated from a third resonator path of the optical resonator filter output from a third through port of the optical resonator filter, the third resonator path located at the reflection side of the optical resonator filter, the third additional light detection means to detect the light output by the light supply device through the first, the second, and the third resonator paths, and the first and the third optical resonators, that does not reach the second optical resonator; and a control means for controlling the operation of the tuning means based on the lights detected by the first and the additional light detection means.

10. A light source wavelength adjustment method comprising:

supplying light into an optical resonator filter from a light supply device at a light input/output side of the optical resonator filter, the optical resonator filter having:
  a first optical resonator positioned at the light input/output side of the optical resonator filter;
  a second optical resonator positioned at a reflection side of the optical resonator filter;
  a third optical resonator positioned between the first and the second optical resonators;
detecting an oscillation light output outside from an output port of the optical resonator filter using a first light detection device;
detecting light deviated from a plurality of resonator paths in the optical resonator filter from a plurality of corresponding through ports of the optical resonator filter using a first additional light detection device, a second additional light detection device, and a third additional light detection device, where:
  the first additional light detection device is to detect light deviated from a first resonator path of the optical resonator filter output from a first through port of the optical resonator filter, the first resonator path located at the light input/output side of the optical resonator filter, the first additional light detection device to detect the light output by the light supply device through the first resonator path that does not reach the first, the second, and the third optical resonators,
  the second additional light detection device is to detect light deviated from a second resonator path of the optical resonator filter output from a second through port of the optical resonator filter, the second resonator path located between the first and the second optical resonators, the second additional light detection device to detect the light output by the light supply device through the first and the second resonator paths and the first optical resonator that does not reach the second and the third optical resonators,
  the third additional light detection device is to detect light deviated from a third resonator path of the optical resonator filter output from a third through port of the optical resonator filter, the third resonator path located at the reflection side of the optical resonator filter, the third additional light detection device to detect the light output by the light supply device through the first, the second, and the third resonator paths, and the first and the third optical resonators, that does not reach the second optical resonator; and
controlling the operation of a tuning device based on each detected light.

11. The light source wavelength adjustment method according to claim 10, further comprising controlling the operation of the tuning device so that an intensity of the oscillation light from the output port to the outside takes a maximum value and, at the same time, an intensity of the light from the through ports takes a minimum value.

12. A light source wavelength adjustment program for causing a computer for controlling the operation of a tuning light source apparatus including an optical resonator filter with a multiple-optical resonator in which a plurality of optical resonators is connected, a light supply device for supplying light into the filter from an input port of the optical resonator filter, and a tuning device for changing a resonance wavelength of the multiple-optical resonator to execute functions of:

instructing the light supply device to supply light into the optical resonator filter at a light input/output side of the optical resonator filter, the optical resonator filter having:
  a first optical resonator positioned at the light input/output side of the optical resonator filter;
  a second optical resonator positioned at a reflection side of the optical resonator filter;
  a third optical resonator positioned between the first and the second optical resonators;
inputting intensity data of a light output to the outside from an output port of the optical resonator filter from a light detection device arranged in advance, via a first light detection device;
inputting intensity data of light deviated from a plurality of resonators path in the optical resonator filter output from corresponding through ports of the optical resonator filter from a light detection device arranged in advance, via a first additional light detection device, a second additional light detection device, and a third additional light detection device, where:
  the first additional light detection device is to detect light deviated from a first resonator path of the optical resonator filter output from a first through port of the optical resonator filter, the first resonator path located at the light input/output side of the optical resonator filter, the first additional light detection device to detect the light output by the light supply device through the first resonator path that does not reach the first, the second, and the third optical resonators,
  the second additional light detection device is to detect light deviated from a second resonator path of the optical resonator filter output from a second through port of the optical resonator filter, the second resonator path located between the first and the second optical resonators, the second additional light detection device to detect the light output by the light supply device through the first and the second resonator paths and the first optical resonator that does not reach the second and the third optical resonators,
  the third additional light detection device is to detect light deviated from a third resonator path of the optical resonator filter output from a third through port of the optical resonator filter, the third resonator path located at the reflection side of the optical resonator filter, the third additional light detection device to detect the light output by the light supply device through the first, the second, and the third resonator paths, and the first and the third optical resonators, that does not reach the second optical resonator; and
controlling the operation of the tuning device based on each intensity data input in a through light intensity input process and an output light intensity input process.

13. The light source wavelength adjustment program according to claim 12, wherein content is specified to control the operation of the tuning device so that an intensity of the light output from the output port to the outside takes a maximum value and, at the same time, an intensity of the light output from the through ports takes a minimum value in the tuning process.

* * * * *